US010045465B2

(12) United States Patent
Ichinose et al.

(10) Patent No.: US 10,045,465 B2
(45) Date of Patent: Aug. 7, 2018

(54) CONTAINER FOR ELECTRONIC DEVICE AND RELAY DEVICE

(71) Applicant: FUJITSU LIMITED, Kawasaki-shi, Kanagawa (JP)

(72) Inventors: Takashi Ichinose, Wakou (JP); Shinichi Kobayashi, Kawasaki (JP); Kenji Aoki, Kawasaki (JP)

(73) Assignee: FUJITSU LIMITED, Kawasaki (JP)

(*) Notice: Subject to any disclaimer, the term of this patent is extended or adjusted under 35 U.S.C. 154(b) by 162 days.

(21) Appl. No.: 15/090,680

(22) Filed: Apr. 5, 2016

(65) Prior Publication Data
US 2016/0324034 A1 Nov. 3, 2016

(30) Foreign Application Priority Data

Apr. 30, 2015 (JP) ................................ 2015-093635

(51) Int. Cl.
*H05K 7/20* (2006.01)

(52) U.S. Cl.
CPC ..... *H05K 7/20572* (2013.01); *H05K 7/20145* (2013.01)

(58) Field of Classification Search
CPC ........... H05K 7/20772; H05K 7/20636; H05K 7/20754; H05K 7/20572; H05K 7/20136; H05K 7/20145; H05K 7/2054; H05K 7/20163; H05K 7/20172; H05K 7/20181; H05K 7/2019; H05K 7/20; H01L 23/46; H01L 23/467
USPC ...... 361/679.33–679.39, 724–727, 361/679.46–679.49, 679.5, 752; 312/223.1–223.2
See application file for complete search history.

(56) References Cited

U.S. PATENT DOCUMENTS

| | | | |
|---|---|---|---|
| 8,064,200 B1* | 11/2011 | West ................. | H05K 7/20563 361/694 |
| 2004/0240177 A1 | 12/2004 | Suzuki et al. | |
| 2007/0092375 A1* | 4/2007 | Liu ..................... | F04D 25/08 416/63 |
| 2013/0146274 A1 | 6/2013 | Sugimoto et al. | |
| 2014/0340846 A1 | 11/2014 | Kurita et al. | |

FOREIGN PATENT DOCUMENTS

| | | |
|---|---|---|
| JP | 2002-118386 | 4/2002 |
| JP | 2005-011304 | 1/2005 |
| JP | 2014-086123 | 5/2014 |
| JP | 2014-225573 | 12/2014 |
| WO | 2012/020496 | 2/2012 |

* cited by examiner

*Primary Examiner* — Dimary Lopez Cruz
*Assistant Examiner* — Ingrid Wright
(74) *Attorney, Agent, or Firm* — Fujitsu Patent Center

(57) ABSTRACT

An effective cooling system is provided by the configuration including: a blower; a first rectifier comprising a first opening that lets a first diversion pass through and a second opening that lets a second diversion divided from airflow pass through downstream a first electronic device; a mixing room that is arranged at a downstream portion of the first rectifier and that mixes the first diversion having passed through the first opening and the second diversion having passed through the second opening; and a second rectifier that is arranged at a downstream portion of the mixing room and includes a third opening and a fourth opening, a mixed airflow of the first diversion and the second diversion passing through the third opening and the fourth opening.

11 Claims, 14 Drawing Sheets

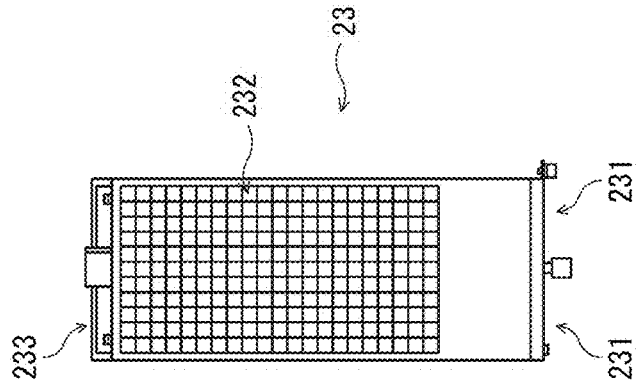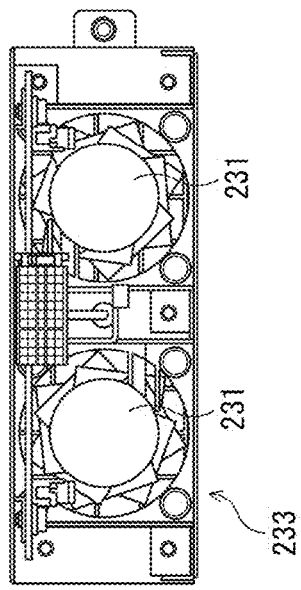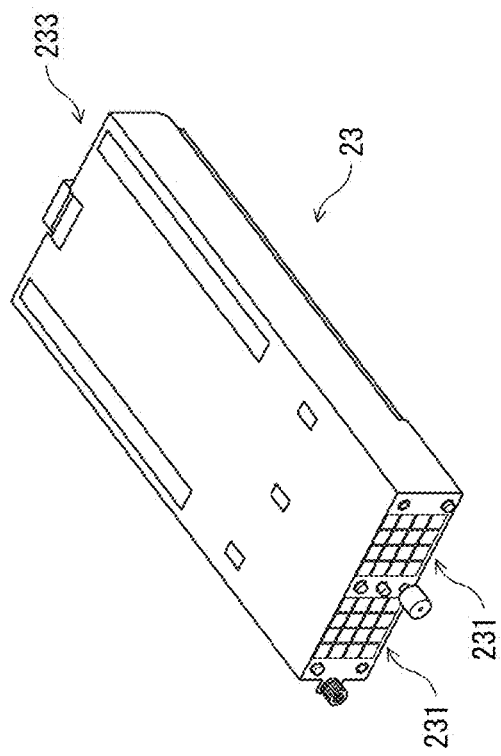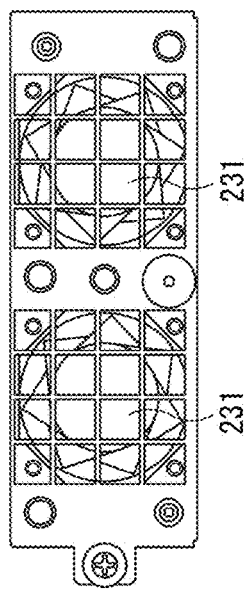

CONTAINER FOR ELECTRONIC DEVICE AND RELAY DEVICE

CROSS-REFERENCE TO RELATED APPLICATION

This application is based upon and claims the benefit of priority of the prior Japanese Patent application No. 2015-093635, filed on Apr. 30, 2015, the entire contents of which are incorporated herein by reference.

FIELD

The embodiment discussed herein is directed to a container for an electronic device and a relay device.

BACKGROUND

An electronic devices such as a storage device has a heat emitting source exemplified by a processor. Stable operation of an electronic device needs cooling of the device. One of the solutions to the above is a cooling fan that is arranged in the casing of the device and that generates airflow around the heat emitting source to cool the heat emitting source with airflow generated around the heat emitting source.

RELATED ART REFERENCE

Patent Literature

[Patent Literature 1] Japanese Laid-open Patent Publication No. 2014-86123 (pages 3-4, FIGS. 1, 2)
[Patent Literature 2] Pamphlet of WO2012/020496
If a casing contains multiple electronic devices, the electronic devices need to be efficiently cooled.

SUMMARY

According to an aspect of the embodiments, a container that contains an electronic device, includes: a blower that generates an airflow; a first electronic device that is arranged to be adjacent to the blower and is arranged on a first flow path, through which a first diversion divided from the airflow passes; a first rectifier comprising a first opening and a second opening, the first diversion being arranged on the first flow path and flowing through the first opening at a downstream portion of the first electronic device, the second opening being arranged on a second flow path, through which a second diversion divided from the airflow passes; a mixing room that is arranged at a downstream portion of the first rectifier and that mixes the first diversion having passed through the first opening and the second diversion having passed through the second opening; a second rectifier that is arranged at a downstream portion of the mixing room and comprises a third opening and a fourth opening, a mixed airflow of the first diversion and the second diversion passing through the third opening and the fourth opening; a second electronic device arranged at a third flow path downstream of the second rectifier, the mixed airflow having passed through the third opening passing through the third flow path; and a third electronic device arranged at a fourth flow path downstream of the second rectifier, the mixed airflow having passed through the fourth opening passing through the fourth flow path.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIGS. 9A to 9D are diagrams illustrating aspects of a fan module included in a relay of an example of the first embodiment;

DESCRIPTION OF EMBODIMENT(S)

Hereinafter, a container for an electronic device and a relay according to a first embodiment will now be detailed with reference to accompanying drawings. The following first embodiment is exemplary and has no intention to exclude various modifications and applications of techniques not referred in the first embodiment. In other words, various changes and modifications can be suggested without departing from the spirit of the first embodiment (e.g., combining the embodiments and/or modifications). The drawings do not illustrate therein all the functions and elements included in the embodiment and may include additional functions and elements to those illustrated in the accompanying drawings.

(A) Configuration

Figure 1:
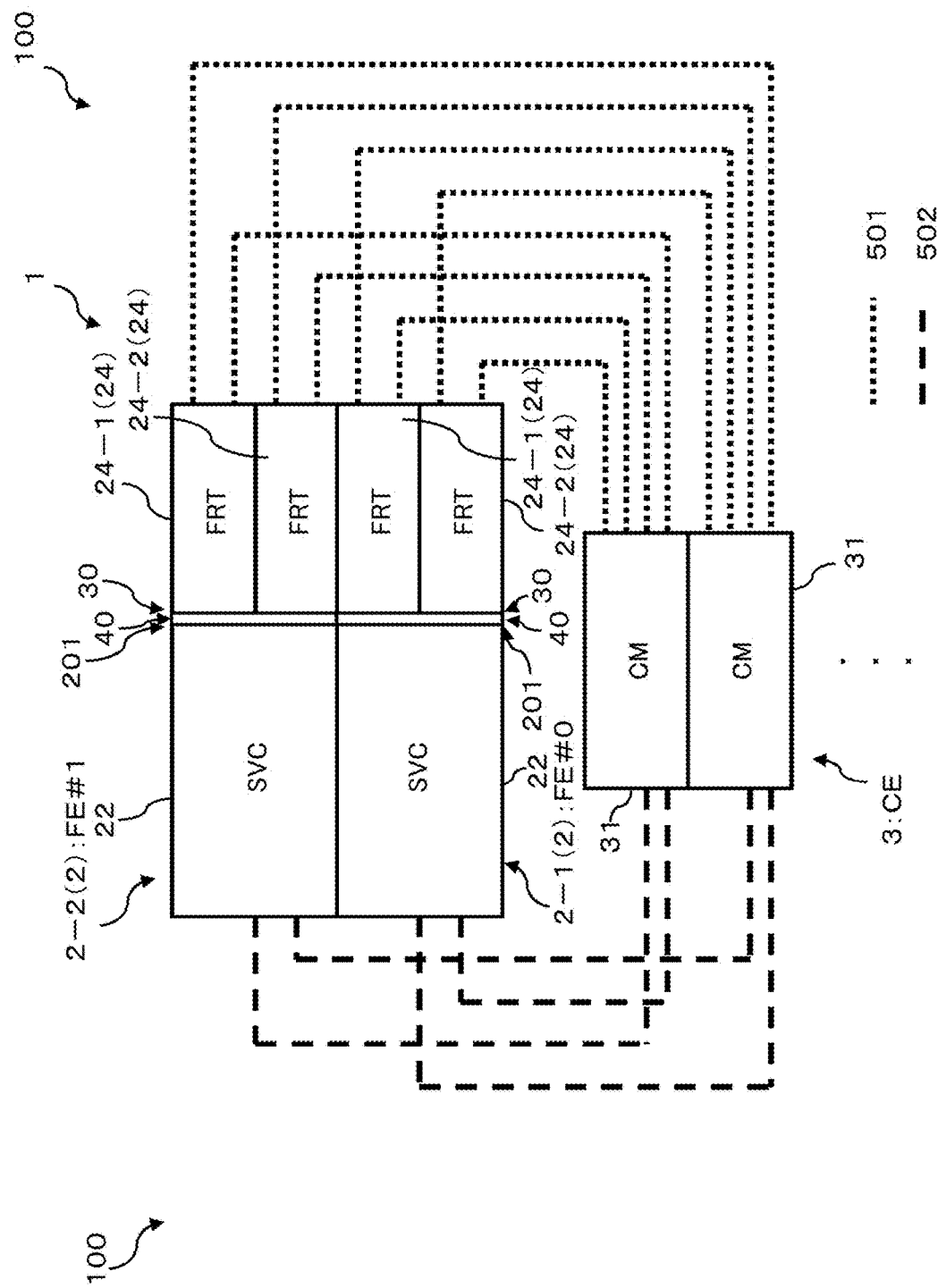
FIG. 1 is a diagram schematically illustrating the hardware configuration of a relay according to an example of a first embodiment.
Figure 2:
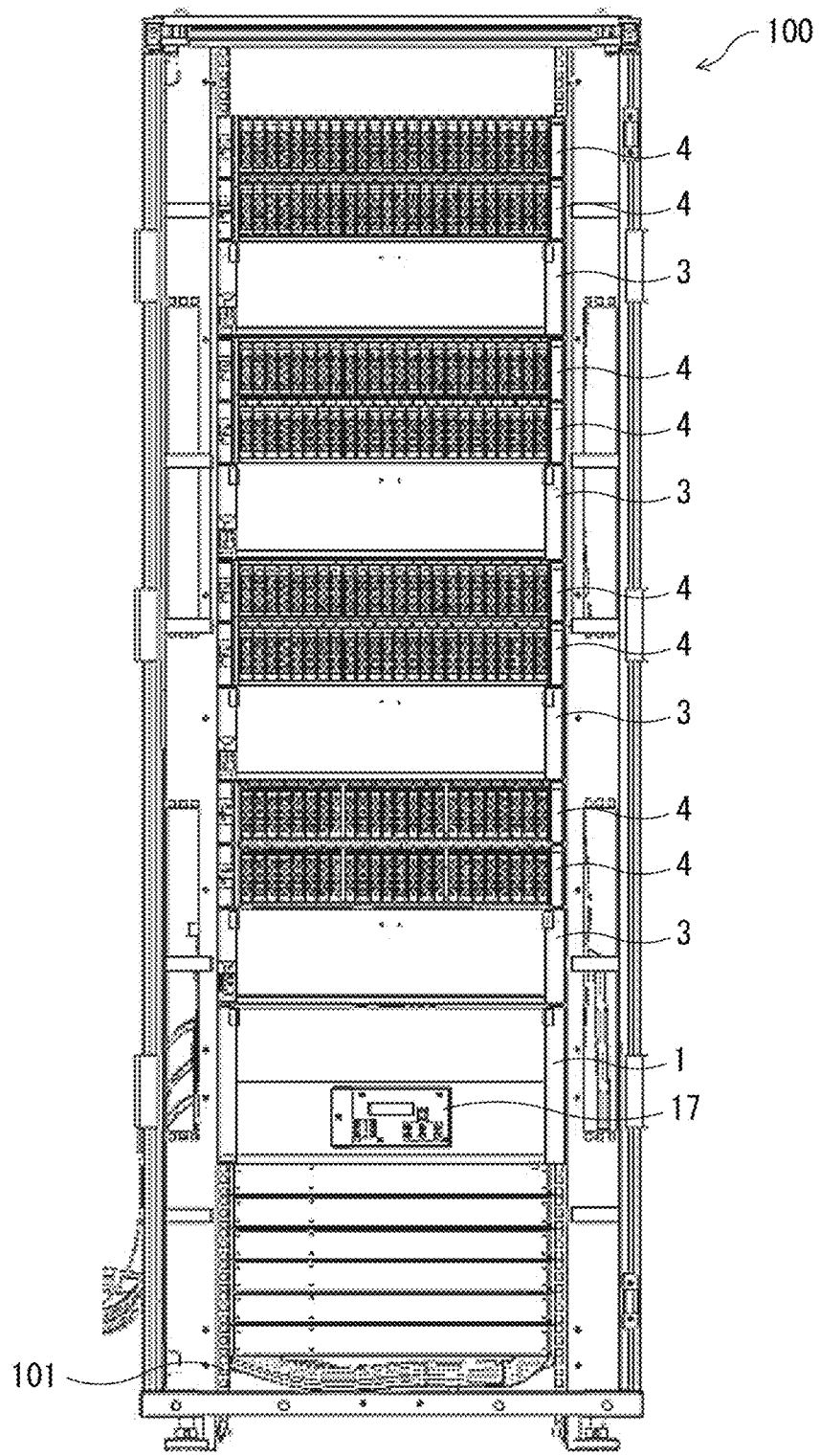
FIG. 2 is a diagram illustrating an example of the aspect of a storage device according to an example of the first embodiment.

FIG. 1 is a diagram schematically illustrating the hardware configuration of a relay (container for an electronic device) 1 according to an example of a first embodiment; and FIG. 2 is a diagram illustrating an example of the aspect of a storage device 100 including the relay.

As illustrated in FIG. 2, the relay (relay device) 1 of an example of the first embodiment is incorporated in the storage device 100.

The storage device 100 mounts thereon multiple memory devices and provides a memory region to a server (not illustrated). An example of the storage device 100 is a Redundant Arrays of Inexpensive Disks (RAID) device. A RAID device retains data, in a manner of being dispersed or redundant, in the multiple memory devices.

In addition to the relay 1, the storage device 100 includes multiple (four in the example of FIG. 2) Controller Enclosures (CEs) 3, multiple (eight in the example of FIG. 2) Disk Enclosures (DEs) 4. The storage device 100 includes a standardized rack 101 such as a 19-inch rack. The relay 1, the CEs 3, the DEs 4, and others are detachably mounted in the rack 101.

Each CE 3 includes multiple Controller modules (CMs) 31 that carry out various controls in obedience to storage access requests from the server.

Each DE 4 includes a memory device that readably and writably stores therein data. Examples of the memory device is a Hard Disk Drive (HDD) and a Solid State Drive (SSD).

The relay 1 communicably connects the multiple CMs 31 to one another. In the first embodiment, the relay 1 includes two Front end Enclosures (FEs) 2-1 and 2-2 the same in configuration in a casing 10 (see FIG. 5). In the casing 10, the FEs 2-1 and 2-2 are piled vertically.

Hereinafter, one of the multiple FEs is discriminated from the remaining by a reference number FE 2-1 or FE 2-2, but any FE is represented by a reference number FE 2. Alternatively, the FE 2-1 and the FE 2-2 are sometimes represented by FE #0 and FE #1, respectively.

The relay 1 maintains the redundancy of the function of the FE 2 by including multiple FEs 2.

Figure 3:
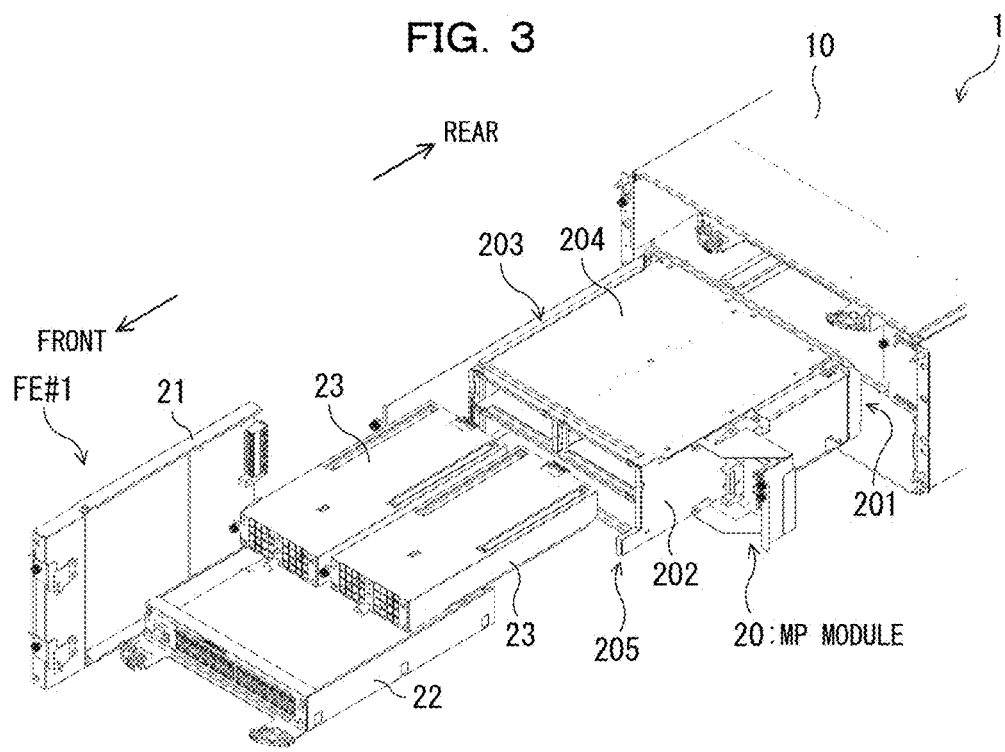
FIG. 3 is an exploded perspective view installing an example of the front side of a relay of an example of the first embodiment.
Figure 4:
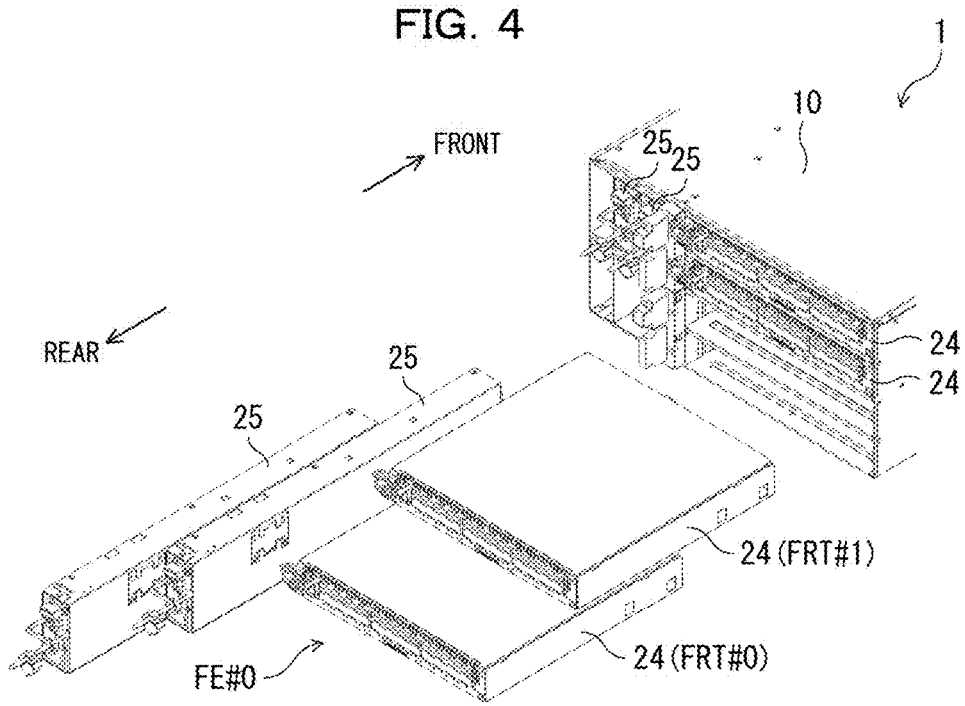
FIG. 4 is an exploded perspective view installing an example of the back side of a relay of an example of the first embodiment.
Figure 5:
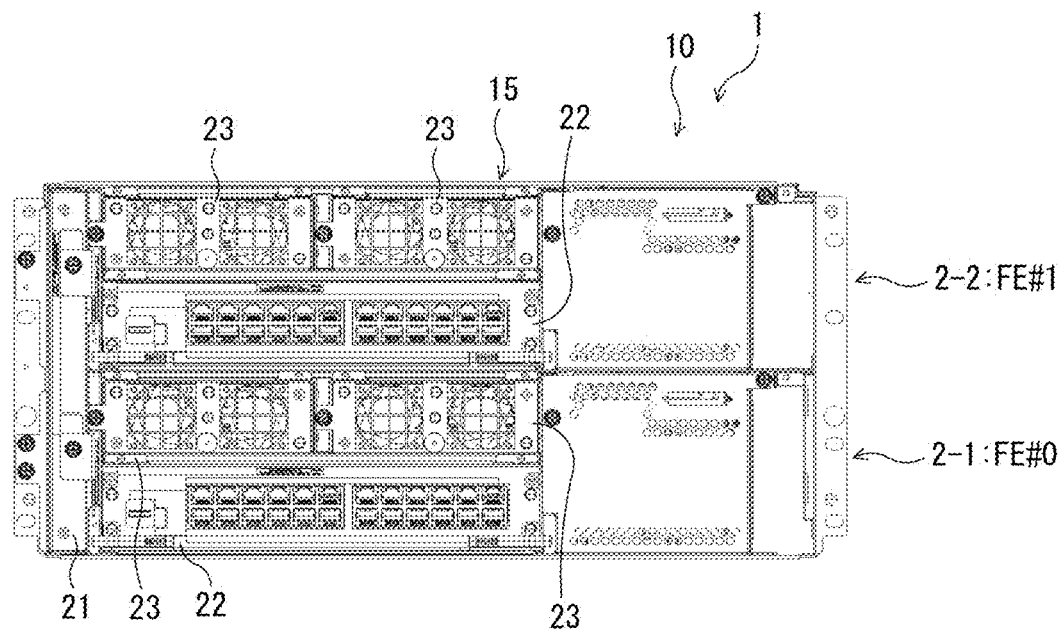
FIG. 5 is a diagram illustrating an example of the aspect of the front side of a relay of an example of the first embodiment.
Figure 6:
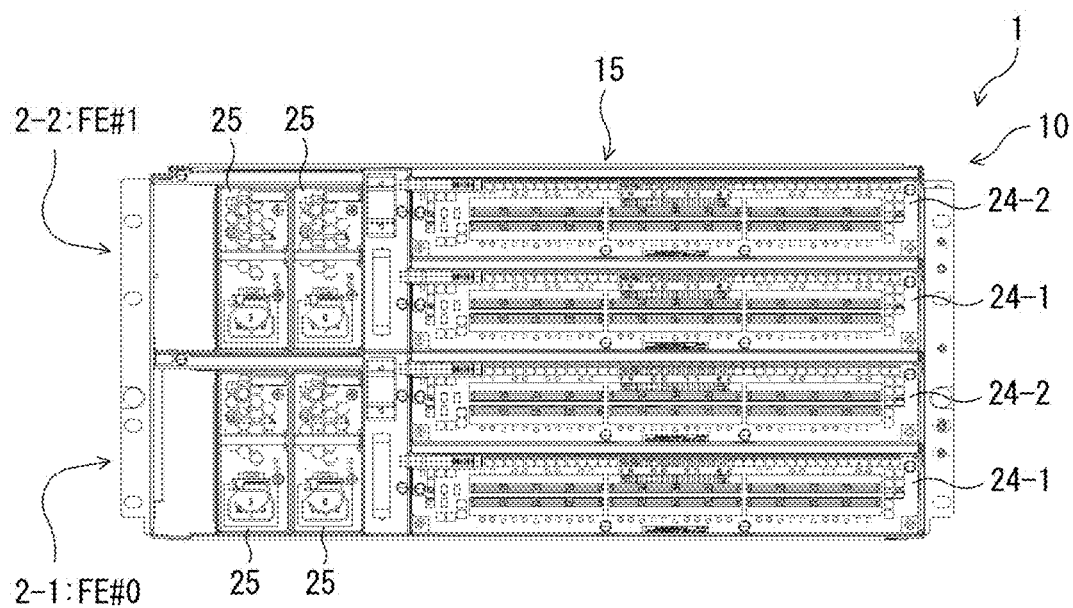
FIG. 6 is a diagram illustrating an example of the aspect of the back side of a relay of an example of the first embodiment.

FIG. 3 is an exploded perspective view illustrating an example of the configuration of the front side of the relay 1 of an example of the first embodiment; FIG. 4 is an exploded perspective view illustrating an example of the configuration of the back side of the relay 1; FIG. 5 diagram illustrating an example of the aspect of the front side of the relay 1; and FIG. 6 is a diagram illustrating an example of the aspect of the back side of the relay 1.

For the convenience of the description, FIG. 3 illustrates the configuration of the FE #1 and FIG. 4 illustrates the configuration of the FE #0.

Each FE 2 of this embodiment includes a Service Controller (SVC) 22 (see FIG. 1), two fan modules 23 (see FIG. 5), two Front end Router (FRTs) 24-1, 24-2 (see FIG. 1), and two Power Supply Units (PSUs) 25 (see FIG. 4).

Hereinafter, one of the FRTs is discriminated from the remaining by a reference number FRT 24-1 or FRT 24-2, but any FRT is represented by a reference number FRT 24. Alternatively, the FRT 24-1 and the FRT 24-2 may be sometimes represented by FRT #0 and FRT #1, respectively.

As illustrated in FIG. 3, each FE 2 includes a Midplane MP) module (first rectifier) 20 disposed at the middle region of the casing 10, and the fan modules 23, the SVC 22, the FRTs 24, the PSUs 25, and others are detachably connected to an MP 201 included in the MP module 20 via non-illustrated connectors.

The fan modules 23, the SVC 22, the FRTs 24, and the PSUs 25 are communicably connected to one another via the MP 201.

As illustrated in FIG. 3, the MP module 20 takes a shape of a rectangular parallelepiped having one face being opened, and the MP 201 in the form of a rectangular plate is disposed on a face opposite to the opening. A rectangular top panel 204 and a rectangular bottom panel 205 are connected to respective long sides of the MP 201 that is opposite to each other. The top panel 204 is arranged in parallel with the bottom panel 205. Rectangular side panels 202, 203 are connected to respective short sides of the MP 201 in parallel with each other. Inside a container portion formed at the space surrounded by the top panel 204, the bottom panel 205, and the side panels 202, 203, the two fan modules 23 and the SVC 22 are placed.

Specifically, as illustrated in FIGS. 3 and 5, the SVC 22 are arranged along the bottom panel 205 at a lower portion in the MP module 20, and two fan modules 23 are arranged in parallel with each other adjacently to the top of the SVC 22.

The fan modules 23, the SVC 22, and the FRTs 24 are communicably connected to one another via the MP 201. Namely, the MP 201 functions as a relay board element that relays data communication among the fan modules 23, the SVC 22, and the FRTs 24.

Hereinafter, for the purpose of convenience of the description, the end of the MP 201 to which the fan modules 23 and the SVC 22 are connected is regarded as the front end and the opposite end is regarded as the rear end. This means that the end of the MP 201 to which the FRTs 24 are connected is regarded as the rear end. For example, the left side of FIG. 3 represents the front side and the right side represents the rear side. In contrast, the left side of FIG. 4 represents the rear side and the right side represents the front side. Hereinafter, the rear side is sometimes called the back side.

As illustrated in FIGS. 4 and 6, the FRTs 24 and the PSUs 25 are connected to the rear face of the MP 201.

As illustrated in FIGS. 4 and 6, the two FRTs 24-1 and 24-2 are installed to the rear face of the MP 201 in parallel with the bottom panel 205 and are arranged so at to be vertically piled. In this embodiment, the FRT 24-2 (FRT #1) is arranged above the FRT 24-1 (FRT #0).

Accordingly, the SVC 22 and the FRT 24-1 are arranged to be opposite to each other, sandwiching the MP 201. Two fan modules 23, 23 and FRT 24-2 are arranged to be opposite to each other, sandwiching the MP 201 (see FIG. 13).

In the casing 10, two PSUs 25 each in the shape of a thin rectangular parallelepiped are arranged along to the front-to-rear direction adjacently to the side panel 203 of the MP module 20.

In the casing 10, the MPs 201 included in respective FEs 2 vertically piled are communicably connected via an MP bridge 21 (see FIG. 3).

Figure 7:
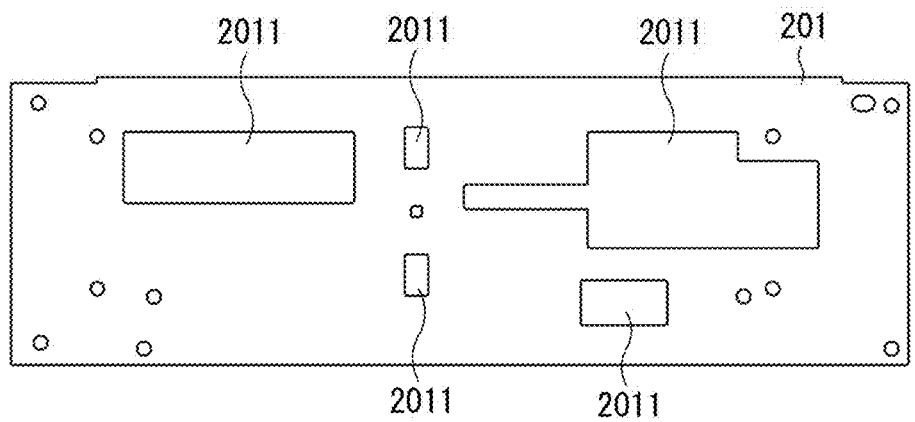
FIG. 7 is a diagram illustrating an example of a midplane (MP) of a relay of an example of the first embodiment.
Figure 8:
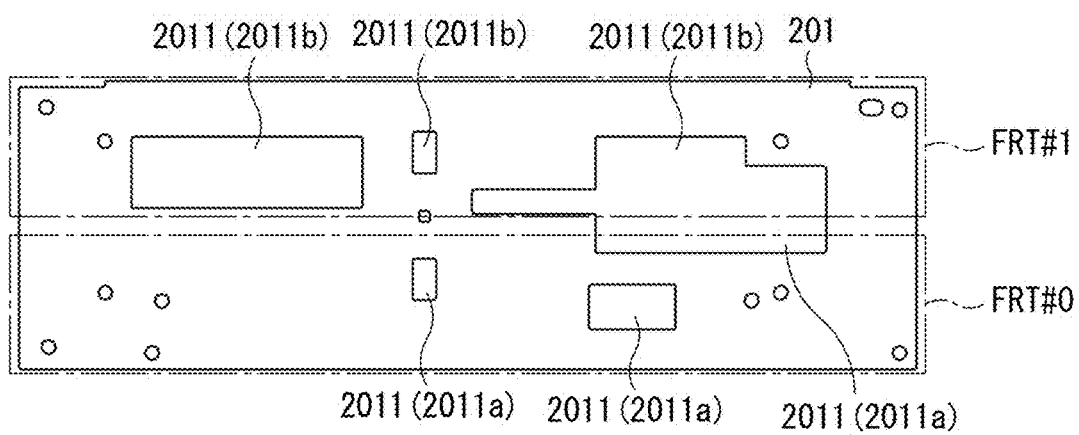
FIG. 8 is a diagram illustrating positional relationship between an MP and a front end router (FRT) of a relay of an example of the first embodiment.

FIG. 7 is a diagram illustrating an example of the MP 201 included in the relay 1 of an example of the first embodiment; and FIG. 8 is a diagram illustrating the positional relationship between the MP 201 and the FRTs 24.

As illustrated in FIG. 7, multiple MP openings 2011 are formed on the MP 201. Each MP opening 2011 is an opening communicating from the top to the bottom of the MP 201. A cooling wind generated by the fan modules 23 to be detailed blow passes through the MP openings 2011.

This means that the flow (movement) of the cooling wind generated by the fan modules 23 is restricted (shielded) by the MP 201.

Among the multiple MP openings 2011 formed on the MP 201, the opening opposite to the FRT #0, which is one of the two FRTs 24 installed in the same casing 10, is referred to as a first MP opening 2011*a*, and the opening opposite to the other FRT #1 is referred to as a second MP opening 2011*b*.

In FIG. 8, the one-dotted lines represents the respective regions of the MP 201 opposite to the FRT #0 and the FRT #1. Specifically, the regions opposite to the FRTs 24 are expressed by projecting the front shape of the respective FRTs 24 onto the MP 201.

As illustrated in FIG. 8, the first MP opening 2011*a* has a larger opening area than that of the second MP opening 2011*b*.

As to be detailed below, the SVC 22 is a monitoring device that carries out various monitoring on the relay 1 of this embodiment and the storage device 100 including the relay 1. Accordingly, more signals are used for controlling the SVC 22 as compared with signals used for fan modules 23, which simply blow air, so that the region to which the SVC 22 is connected to has larger numbers and areas of the print wiring and the print circuits than those of the region to which the fan modules 23 are connected. Consequently, the MP 201 forms a larger opening at the region to which the fun modules 23 are connected than an opening at the region to which the SVC 22 is connected. For this reason, the first MP opening 2011*a* is larger than the second MP opening 2011*b*.

As illustrated in FIGS. 3 and 5, in the relay 1 of this embodiment, the two fan modules 23 and the SVC 22 are connected to one face (i.e., front face) of the MP 201.

FIGS. 9A-9D are diagrams illustrating the aspect of the fan module 23 included in the relay 1 of an example of the first embodiment. Specifically, FIG. 9A is a perspective view; FIG. 9B is a bottom view; FIG. 9C is a front view; and FIG. 9D is a back view.

Each fan module 23 is a blower equipped with a fan 231 that generates airflow (cooling wind). In the example of FIGS. 9A-9D, each fan module 23 includes two fans 231 and these two fans 231 are contiguously arranged at the front side of the fan module 23.

On the opposite side (back face) to the face (front face) on which the fans 231 are arranged in the fan module 23, a back face opening (second blowing outlet) 233 is formed as illustrated in FIG. 9D. Part of the cooling wind generated by the fans 231 is ejected from the back face opening 233.

As illustrated in FIG. 9B, a rectangular bottom opening (first blowing outlet) 232 are formed on the bottom face of the fan module 23. Part of the cooling wind generated by the fans 231 is ejected also from the bottom opening 232.

In the example of FIG. 9B, a lattice lid is arranged on the bottom opening 232. The presence of the lid ensures the strength of the fan module 23 without hindering the passage of the cooling wind and avoids the ejection of dust and others from the fan module 23 to the outside.

Hereinafter, part of the cooling wind being generated by the fans 231 and being ejected from the bottom opening 232 is referred to as first diversion and part of the cooling wind ejected from the back face opening 233 is referred to as second diversion. A flow path through which the first diversion flows is referred to as a first flow path and a flow path through which the second diversion flows is referred to as a second flow path.

The second diversion ejected from the back face opening 233 of the fan module 23 passes through the second MP opening 2011*b* of the MP 201.

The example of FIG. 9B illustrates the single rectangular bottom opening 232, but any alternative can be suggested. Alternatively, the shape of the bottom opening 232 may be round or other shape; and two or more bottom openings 232 may be formed.

Likewise, the example of FIG. 9D illustrates the single rectangular back face opening 233, but any alternative can be suggested. Alternatively, the shape of the back face opening 233 may be round or other shape; and two or more back face openings 233 may be formed.

The number of the fans 231 included in each fan module 23 is not limited two. Alternatively, the fan module 23 may include one, three, or more fans 231 and various modifications can be suggested. The fan 231 may be of a different type, such as a sirocco fan.

Figure 10:
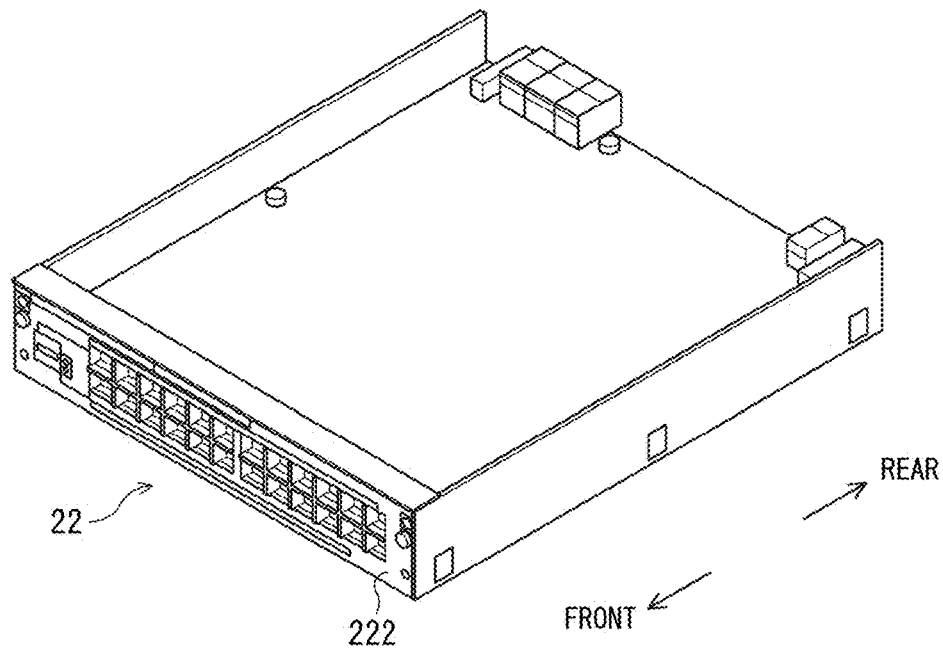
FIG. 10 is a perspective view illustrating an example of the configuration of a service controller (SVC) included in a relay of an example of the first embodiment.

FIG. 10 is a perspective view illustrating an example of the configuration of the SVC 22 included in the relay 1 of an example of this embodiment.

The SVC 22 is a monitoring device (first electronic device, controller) that carries out various monitoring on the relay 1 of this embodiment and the storage device 100 including the relay 1. For example, the SVC 22 communicates with each CM 31 to collect error state information, which is accumulated into an error log. The SVC 22 also functions as a managing device that manages communication between the CMs 31 and the FRTs 24. The SVC 22 is connected to all the CMs 31 via respective monitoring buses 502.

As illustrated in FIG. 3, the SVC 22 is arranged, for example, below the fan modules 23 in the casing 10 of the relay 1 of this embodiment.

As illustrated in FIG. 10, the SVC 22 includes a front panel 222 on which multiple connectors are arranged to allow cables to insert into and extract from the connectors. Furthermore, as illustrated in FIG. 10, the SVC 22 has a shape of removing the top face and the back face, which is opposite to the front panel 222 from the six faces constituting a rectangular parallelepiped, so that the board module 221 (see FIG. 13) accommodated in the SVC 22 is exposed.

With this configuration, the cooling wind (first diversion) ejected from the bottom opening 232 of the fan module 23 flows into the SVC 22 without being hindered, and is ejected from the back face of the SVC 22.

The board module 221 is disposed in the SVC 22. The cooling wind from the fan modules 23 cools the board module 221 and then is ejected from the back side of the SVC 22. FIG. 10 omits illustration of the board module 221.

The cooling wind (first diversion) ejected from the back side of the SVC 22 passes through the first MP opening 2011*a* of the MP 201. This means that the SVC 22 is arranged on the first flow path through which the first diversion passes.

Figure 11:
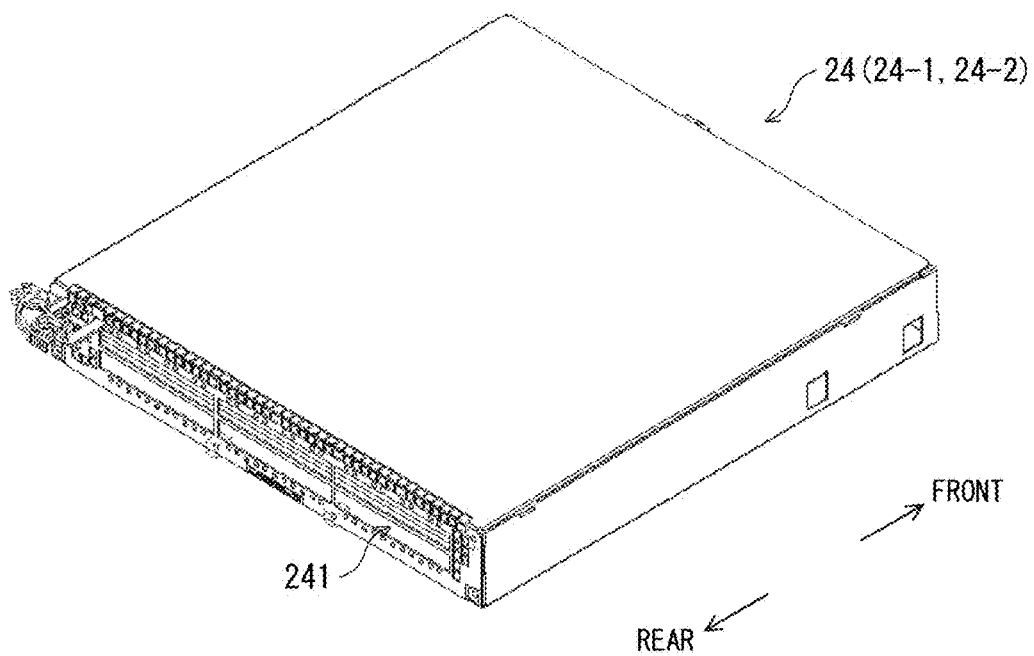
FIG. 11 is a perspective view illustrating an example of the configuration of an FRT included in a relay of an example of the first embodiment.

FIG. 11 is a perspective view illustrating an example of the configuration of FRT 24 included in the relay 1 of an example of the first embodiment.

Each FRT 24 is a communicating device (connection controller) that achieves communication (CM-CM communication) among the multiple CMs 31. Each FRT 24 is connected to all the CMs 31 via, for example, respective Peripheral Component Interconnection Express (PCIe)

buses 501. Accordingly, each CM 31 is connected to all the FRTs 24 via the PCIe buses 501.

Each FRT 24 takes an aspect shape of a rectangular parallelepiped box and includes multiple connectors disposed on a panel 241 that forms one of the six faces of the rectangular parallelepiped. To these connectors, the CMs 31 are connected via non-illustrated cables.

Figure 13:
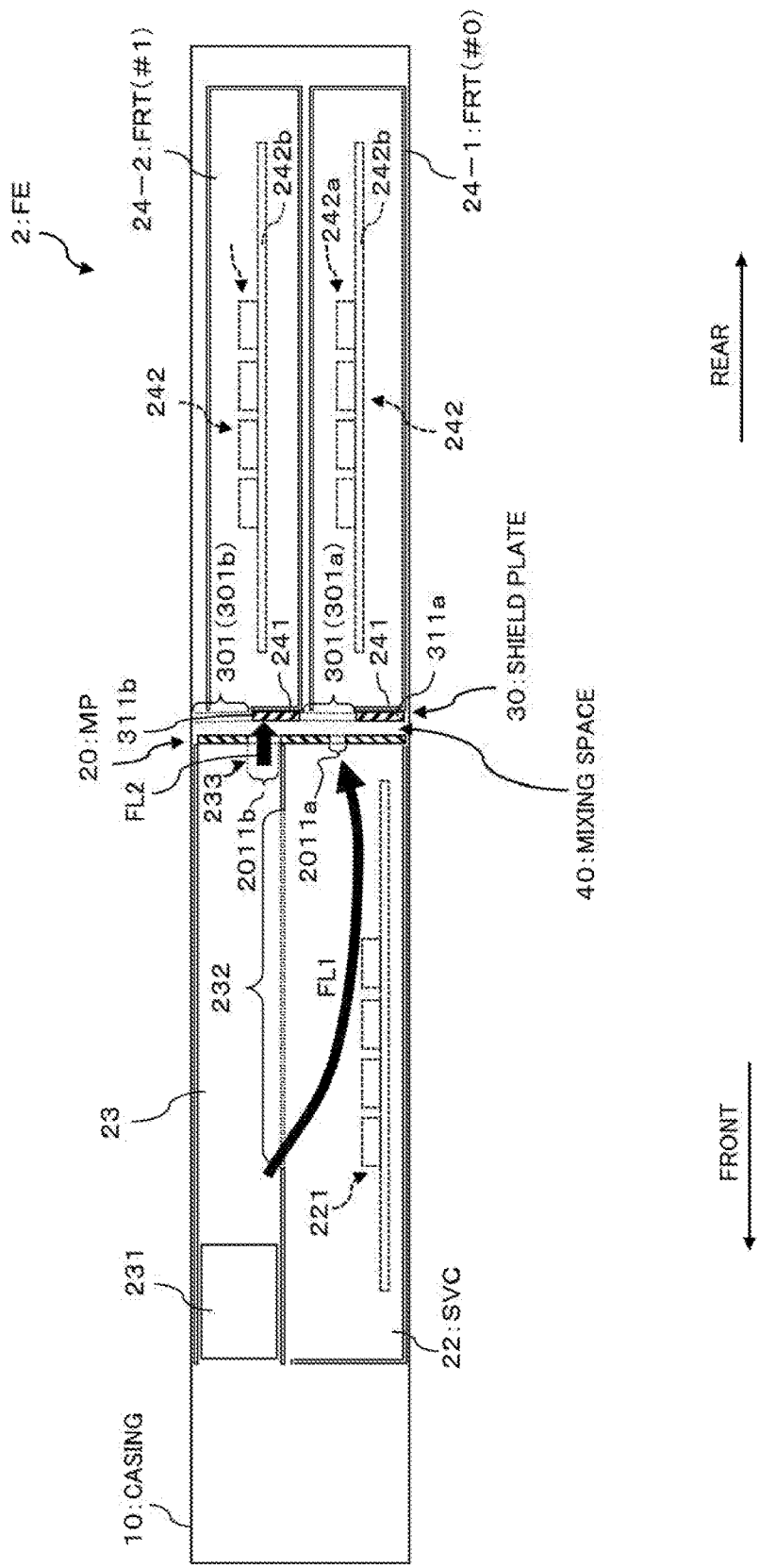
FIG. 13 is a front-to-end diagram illustrating an arrangement in a front end enclosure (FE) in a relay according to an example of the first embodiment.

A board module 242 is disposed inside each FRT 24 (see FIG. 13). The board module 242 is fabricated by arranging circuit parts 242a on one side of a printed board 242b. The circuit parts 242a includes a processor, which emits heat while the FRT 24 is operating and is therefore to be cooled.

In each FRT 24 of the relay 1 of this embodiment, the board module 242 is arranged such that the face with the circuit parts 242a lie upwards.

Figure 12:
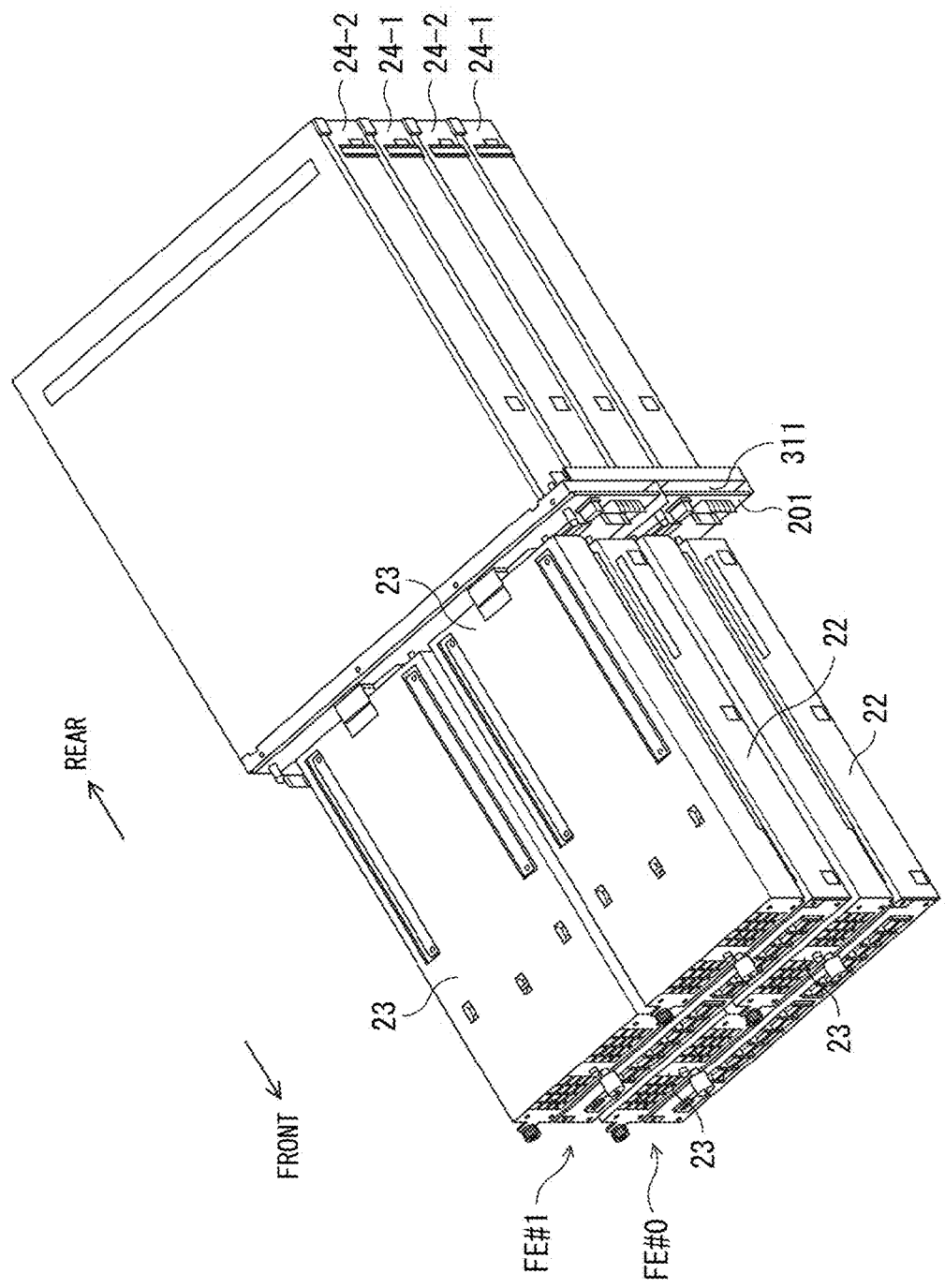
FIG. 12 is a perspective view illustrating an arrangement in a relay of an example of a first embodiment.
Figure 14:
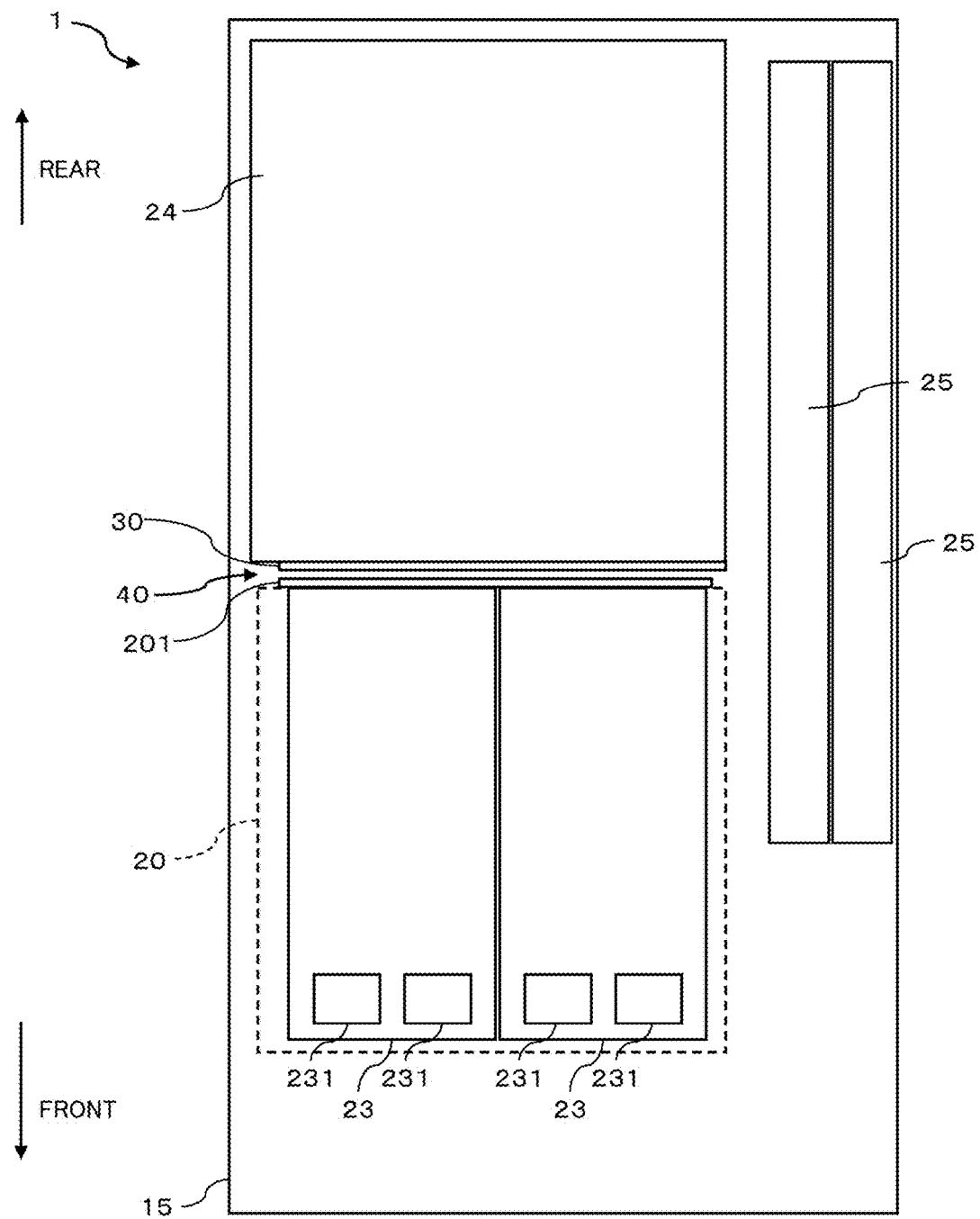
FIG. 14 is a sectional view seen from the top side of a relay of an example of the first embodiment.

FIG. 12 is a perspective view illustrating the arrangement in the relay 1 according to an example of this embodiment; FIG. 13 is a front-to-end cross sectional view illustrating arrangement in an FE 2 of the relay 1 according to an example of this embodiment; and FIG. 14 is a sectional view seen from the top side of FIG. 13. For the purpose of convenience of the description, FIGS. 12-14 illustrate excerpted partial configurations. FIG. 13 hatches only the sections of the MP 201 and a shielding plate 30.

In FIG. 13, the left side corresponds to the front side of the FE 2 while the right side corresponds to the rear side of the FE 2. In FIG. 14, the lower side corresponds to the front side of the FE 2 and the upper side corresponds to the rear side of the FE 2. Hereinafter, the rear side is sometimes referred to as the back side.

As illustrated in FIGS. 12-14, the MP 201 is arranged at the center position of the front-to-rear direction of the casing 10 so as to shut the inside of the casing 10 and, at a forward position of the MP 201, the fan modules 23 and the SVC 22 are arranged. The two fan modules 23 are contiguously arranged above the SVC 22. As illustrated in FIG. 13, the fan modules 23 are arranged in such a posture that the respective bottom openings 232 are opposite to the SVC 22 downwardly. The back face openings 233 of the fan modules 23 are opposite to the MP 201.

As illustrated in FIG. 13, in a rearward position of the MP 201, the FRTs 24 are arranged so as to be piled vertically. In a rearward position of the fan modules 23, the FRT #1 (third electronic device, second connection controller) is arranged. In a rearward position of the SVC 22, the FRT #0 (second electronic device, first connection controller) is arranged.

In a rearward position of the MP (first rectifier) 201, a shielding plate (second rectifier) 30 is arranged between the MP 201 and FRTs 24 in parallel with the MP 201, so that a space 40 is formed between the MP 201 and the shielding plate 30. In the space 40, cooling wind (second diversion FL2) that has flown out of the back face opening 233 of the fan modules 23 and that has passed through the second MP opening 2011b of the MP 201 is mixed with cooling wind (first diversion FL1) that has been ejected from the back face opening 233 of the SVC 22 and that has passed through the first MP opening 2011a of the MP 201. Hereinafter, the space 40 is also referred to as a mixing space (mixing room) 40.

Hereinafter, the fluid obtained by mixing the cooling wind (first diversion FL1) having passed through the first MP opening 2011a and the cooling wind (second diversion FL2) having passed through the second MP opening 2011b in the mixing space 40 is sometimes referred to as the mixed flow.

As illustrated in FIG. 13, the shielding plates 30 are arranged at a downstream position of the mixing room 40 in parallel with the MP 201. The shielding plates 30 shields part of the mixed flow that is mixed in the mixing space 40 and that is to flow into the FRTs 24 so that the mixed flow equally flows into both the FRT #0 and FRT #1.

Figure 15:
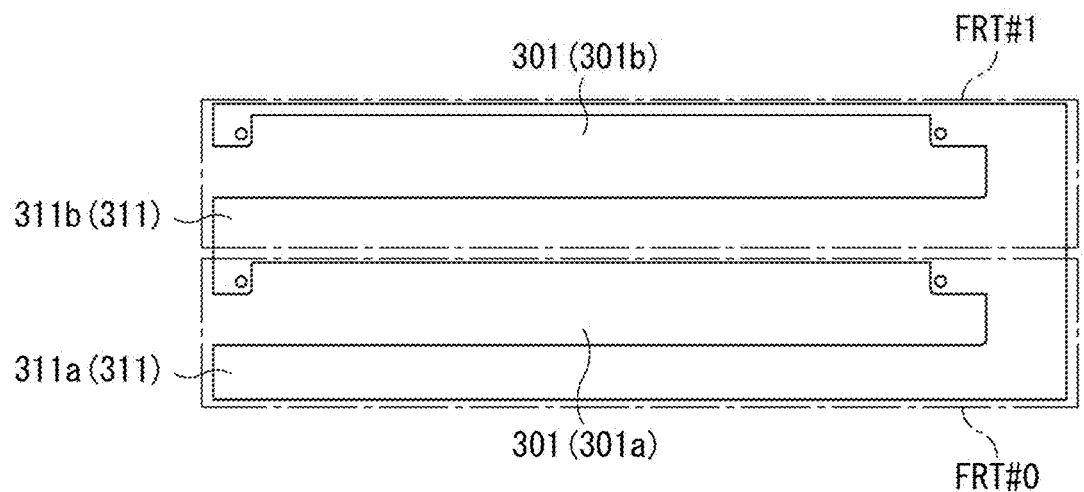
FIG. 15 is a diagram illustrating a shielding plate included in a relay of an example of the first embodiment.

FIG. 15 is a diagram illustrating the shielding plate 30 of the relay 1 according to an example of the first embodiment. As illustrated in FIG. 15, the shielding plate 30 is formed of a rectangular plate having the substantially same size as the MP 201 and has two shielding-plate openings 301 formed thereon. The part of the shielding plate except for the shielding-plate openings 301 is referred to as a shielding part 311.

In FIG. 15, the portions enclosed by the one-dotted lines represents portions on the shielding plate 30 that are to be opposite to the FRT #0 and FRT #1. Namely, the portions to be opposite to the FRTs 24 are represented by projecting the front shape the FRTs 24 onto the shielding plate 30.

As illustrated in FIG. 15, one of the shielding-plate openings 301 and the shielding part 311 are opposite to each FRT 24. One of the shielding-plate openings 301 that is formed on the shielding plate 30 and that is opposite to the FRT #0 is referred to as the first shielding-plate opening 301a and the other shielding-plate opening 301 that is opposite to the FRT #1 is referred to as the second shielding-plate opening 301b.

Accordingly, the FRT #0 is arranged on a third flow path through which the mixed flow having passed through the first shielding-plate opening 301a of the shielding plate 30 passes while the FRT #1 is arranged on a fourth flow path through which the mixed flow having passed through the second shielding-plate opening 301b of the shielding plate 30 passes.

On the shielding plate 30, the first shielding-plate opening 301a and the second shielding-plate opening 301b have the similar shapes and also have the same or substantially the same opening area. This can cause the same amount of mixed flow to flow into the FRT #0 and the FRT #1 from the mixing space 40, so that the FRT #0 and the FRT #1 can be equally cooled.

The shielding part 311 formed on the shielding plate 30 can be imaginarily divided into a first shielding part 311a opposite to the FRT #0 and a second shielding part 311b opposite to the FRT #1.

In the first embodiment, as illustrated in, for example, FIG. 13, the shielding-plate opening 301 is formed on the upper part at a forward position of each FRT 24 and the shielding part 311 is formed below the shielding-plate opening 301.

As illustrated in FIG. 13, the circuit parts 242a that emit heat are arranged on the upper surface of the board module 242 installed in each FRT 24, which has been described above. This means that, the upper side of each FRT 24 is a region having heat emitting sources and being to be cooled and the lower side of the FRT 24 is a region being free from a heat emitting source and being not to be cooled.

The shielding-plate openings 301 are formed opposite to the regions to be cooled on the respective FRTs 24 and the shielding part 311 are formed opposite to the regions free from heat emitting sources on the respective FRTs 24.

Figure 16:
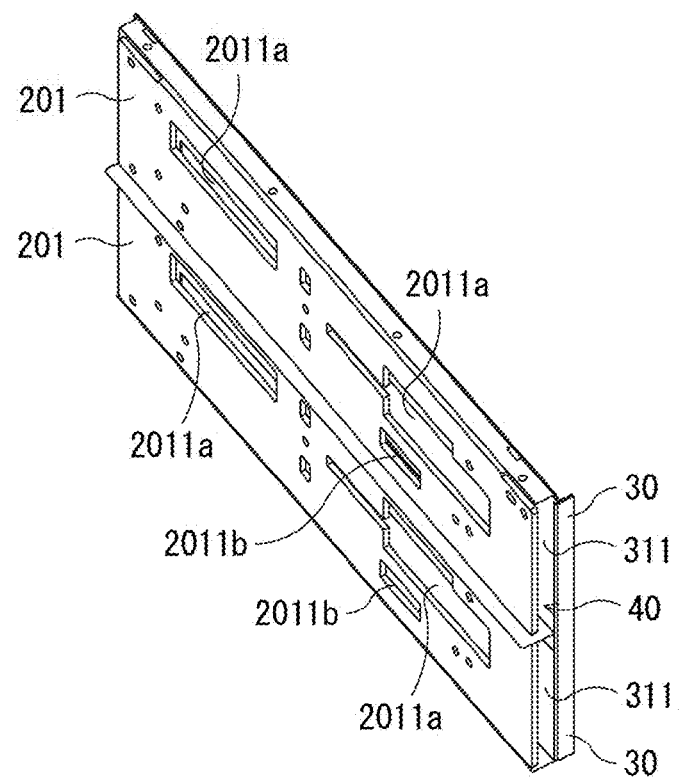
FIG. 16 is an entire perspective view illustrating positional relationship between an MP and a shielding plate in a relay of an example of the first embodiment.
Figure 17:
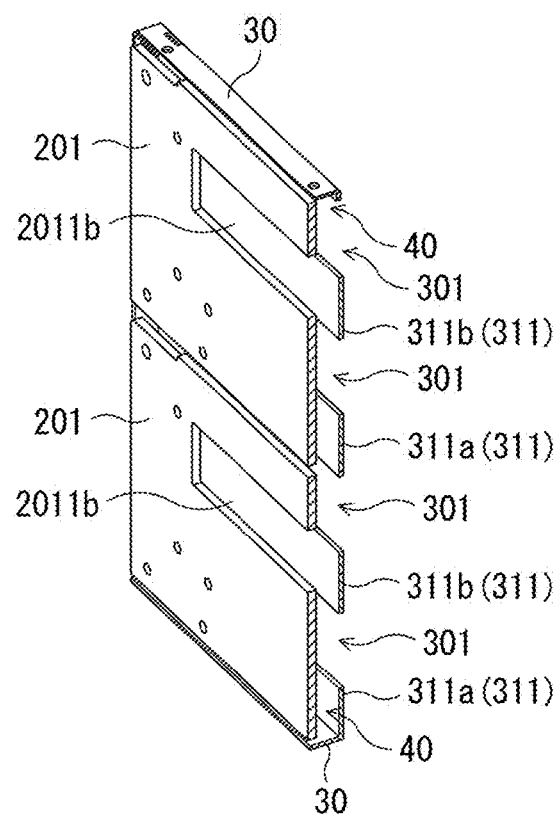
FIG. 17 is a perspective view illustrating part of the shape of a cross section of positional relationship of an MP and a shielding plate of a relay of an example of the first embodiment.

FIGS. 16 and 17 are diagrams illustrating positional relationship between the MP 201 and the shielding plate 30 in the relay 1 according to an example of the first embodiment. Specifically, FIG. 16 is an entire perspective view and FIG. 17 is a perspective view illustrating a partial cross-sectional shape of FIG. 16.

As illustrated in FIG. 16, the MP 201 is arranged opposite to and in parallel with the shielding plate 30, and the mixing space 40 are formed between the MP 201 and the shielding plate 30.

As illustrated in FIG. 17, the second shielding part 311b arranged at a position opposite to the second MP opening 2011b formed on the MP 201 via the mixing space 40.

As described above, between the fan modules and the downstream FRTs 34, the cooling wind is rectified in two steps by the MP 201 and the shielding plate 30 (i.e., two-step rectification, two-step shielding).

(B) Operation:

Description will now be made in relation to flow of cooling air in the relay 1 according to an example of the first embodiment having the above configurations with reference to FIGS. 18 and 19.

Figure 18:
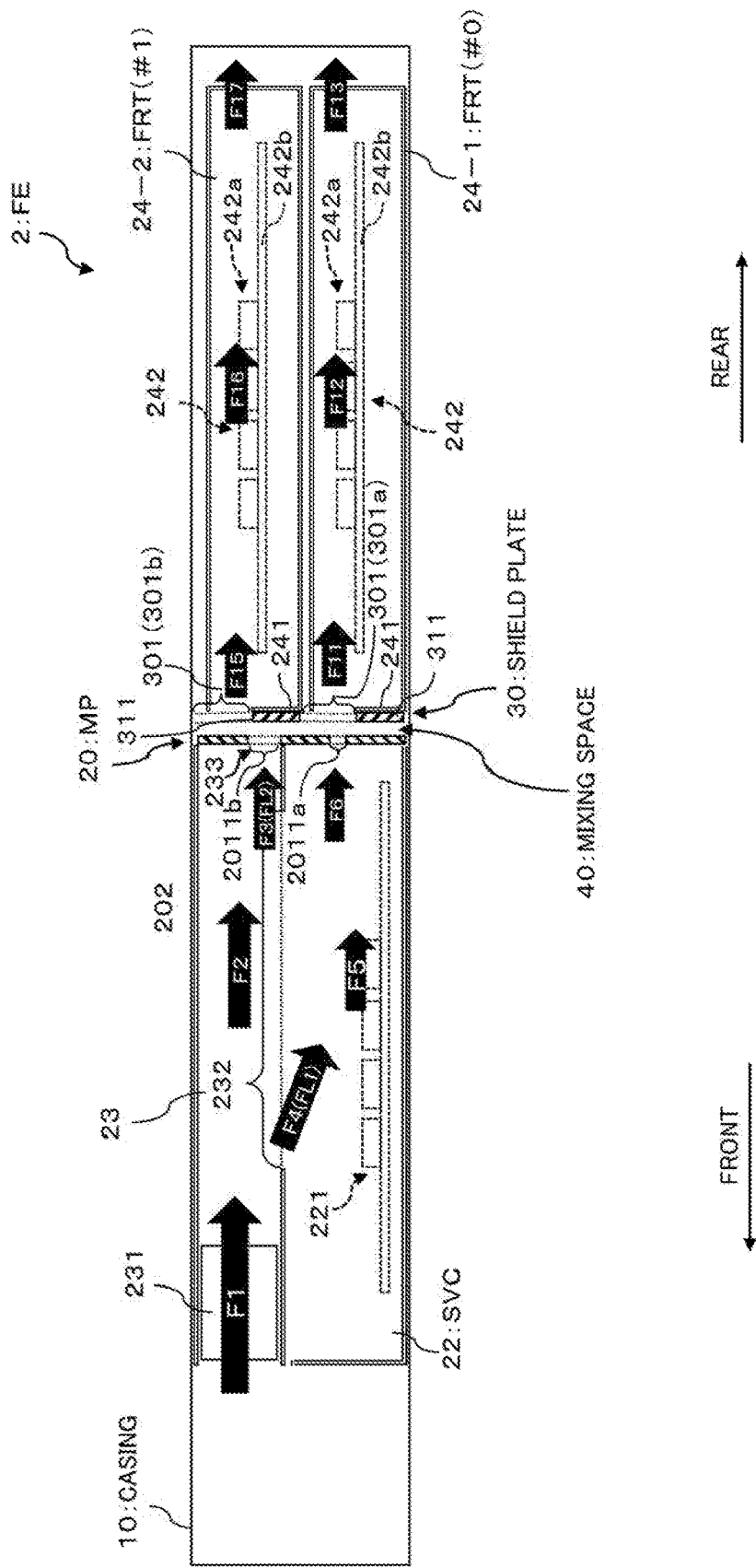
FIG. 18 is a front-to-end sectional view illustrating flow paths of cooling wind in a relay of an example of the first embodiment.
Figure 19:
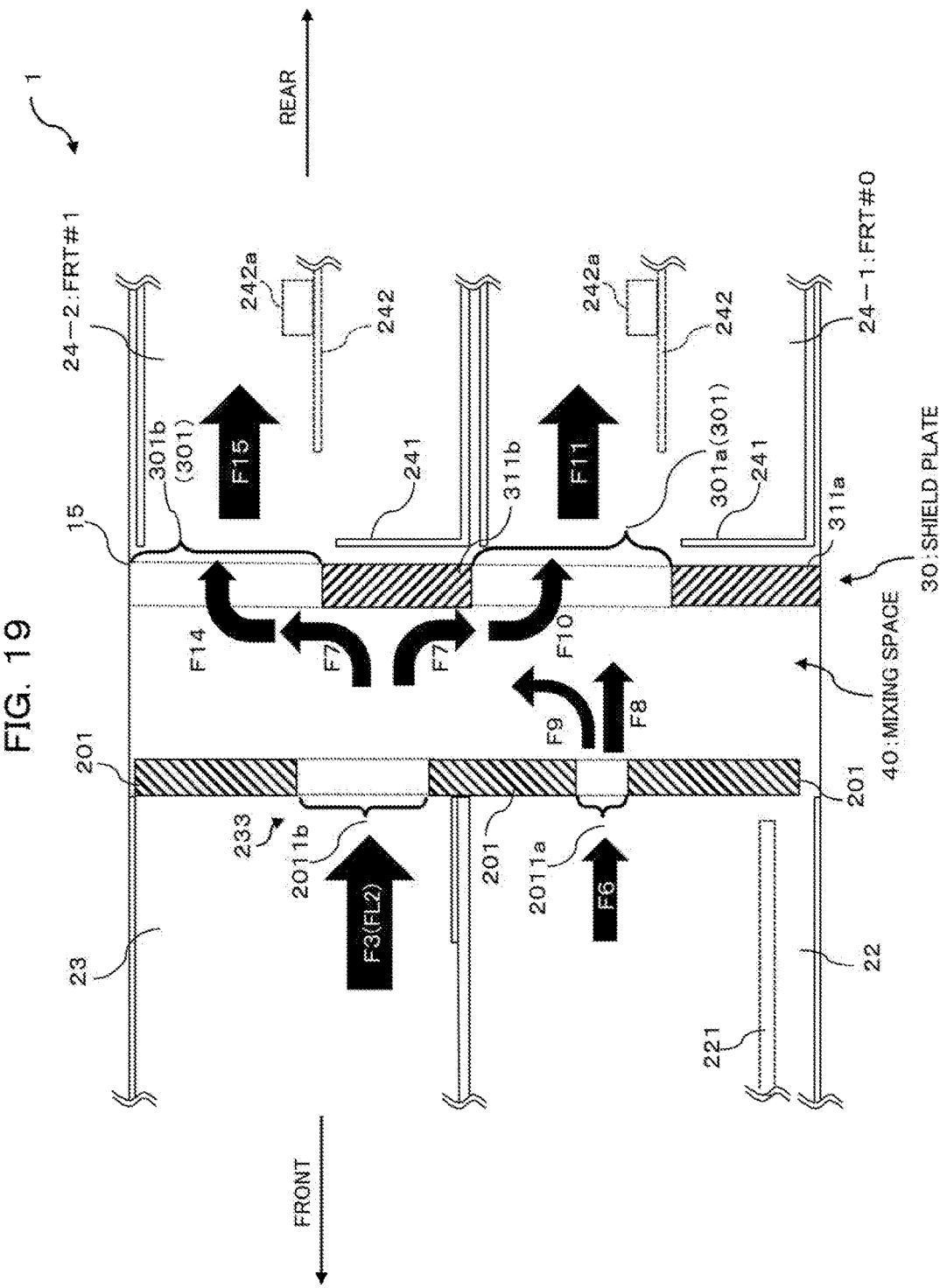
FIG. 19 is a front-to-end sectional view illustrating flow paths of cooling wind in a mixing space of a relay according to an example of the first embodiment.

FIG. 18 is a front-to-end sectional view illustrating flow paths of cooling wind in the relay 1 of an embodiment of the first embodiment, and FIG. 19 is a front-to-end sectional view illustrating the flow paths of the cooling wind in the mixing space 40.

In the FE 2, activating the fans 231 in the fun modules 23 generates airflow (cooling wind) and the airflow drawn through the front faces of the fan modules 23 enters the fan modules 23 (see Arrow F1 in FIG. 18).

Part of the airflow having entered the fan modules 23 passes through the fan modules 23 (see Arrow F2 in FIG. 18) and is then ejected towards the rear from the back face openings 233 of the fan modules 23 (second diversion FL2, see Arrow F3 in FIG. 18). The second diversion FL2 ejected from the back face openings 233 of the fan modules 23 passes through the second MP opening 2011b of the MP 201 and then enters the mixing space 40. Here, the flow path through which the second diversion FL2 passes is the second flow path.

Part of the airflow having entered the fan modules 23 passes through the bottom openings 232 of the fan modules 23 and is then ejected also downwards of the fan modules 23 (first diversion FL1, (see Arrow F4 in FIG. 18). Here, the flow path through which the first diversion FL1 passes is the first flow path.

Since the SVC 22 is arranged below the fan modules 23, the first diversion FL1 having passed through the bottom openings 232 of the fan modules 23 enters the SVC 22. The first diversion FL1 having entered the SVCs 22 cools the board module 221 while passing through the surrounding of the board module 221 in the SVC 22 (see Arrow F5 in FIG. 18). The first diversion FL1 having passed through the SVC 22 and is then ejected towards the rear from the back face of the SVC 22 (see Arrow F6 in FIG. 18). The first diversion FL1 ejected towards the rear from the back face passes through the first MP openings 2011a of the MP 201 and then flows into the mixing space 40.

The second diversion FL2 that has flown into the mixing space 40 through the second MP opening 2011b impacts on the second shielding part 311b arranged opposite to the second MP opening 2011b and is consequently diffused in the mixing space 40 (see Arrow F7 in FIG. 19).

On the other hand, the first diversion FL1 that has flown into the mixing space 40 through the first MP opening 2011a (see Arrow F8 in FIG. 19) meets the second diversion FL2 diffused by the second shielding part 311b as described above and is mixed with the second diversion FL2.

Part of the first diversion FL1 that has flown into the mixing space 40 through the first MP opening 2011a is diffused in the mixing space 40 and moves towards the second MP opening 2011b (see Arrow F9 in FIG. 19). The first diversion FL1 having moved towards the second MP opening 2011b is mixed with the second diversion that has flown through the second MP opening 2011b.

As the above, the second diversion FL2 that has flown through the second MP opening 2011b is mixed with the first diversion FL1 that has flown through the first MP opening 2011a in the mixing space 40. The first diversion FL1 and the second diversion FL2 are mixed into the mixed flow.

As described above, on the MP 201, the second MP opening 2011b formed in a rear position of the back face openings 233 of the fan modules 23 is larger than the first MP opening 2011a formed in a rear position of the SVC 22. Accordingly, the amount of cooling wind passing through the second MP opening 2011b is larger than that passing through the first MP opening 2011a. However, at the downstream portion of the second MP opening 2011b in the mixing space 40, a second shielding part 311b of the shielding plate 30 is arranged opposite to the second MP opening 2011b. This prevents the entire cooling wind ejected from the second MP opening 2011b from directly flowing into the FRT #1. The first shielding-plate openings 301a has the similar shape to that of the second shielding-plate openings 301b and has the same or substantially the same opening area as the second shielding-plate openings 301b.

With this configuration, roughly the same amount of mixed flow enters both the FRT #1 disposed in a rear position of the fan modules 23 and the FRT #0 disposed in a rear position of the SVC 22.

Part (first mixed flow) of the mixed flow generated in the mixing space 40 passes through the first shielding-plate openings 301a of the shielding plate 30 (see Arrow F10 in FIG. 19), and then enters the FRT #0 through the gap of the panel 241 of the FRT #0 (see Arrow F11 in FIG. 19). The path through which the first mixed flow passes is a third flow path.

The first mixed flow having entered the FRT #0 cools the circuit parts 242a of the heat emitting sources while passing through the surrounding of the board module 242 in the FRT #0 (see Arrow F12 in FIG. 18).

The first shielding part 311a prevents the mixed flow from entering a region below the printed board 242b in the FRT #0. This increases the amount of mixed flow entering the upper side of the printed board 242b in the FRT #0, so that the circuit parts 242a can be efficiently cooled.

The first mixed flow having passed through the FRT #0 is then ejected rearwards from the back side of the FRT #0 (see Arrow F13 in FIG. 18).

The remaining part (second mixed flow) of the mixed flow generated in the mixing space 40 except for the first mixed flow passes through the second shielding-plate opening 301b of the shielding plate 30 (see Arrow F14 in FIG. 19), and then enters the FRT #1 through a gap of the panel 241 of the FRT #1 (see Arrow F15 in FIG. 19). The flow path through which the second mixed flow passes is a fourth flow path.

The second mixed flow having entered the FRT #1 cools the circuit parts 242a that are heat emitting source while passing through the surrounding of the board module 242 in the FRT #1 (see Arrow F16 in FIG. 18).

Also in the FRT #1, the first shielding part 311a prevents the mixed flow from entering a region below the printed board 242b. This increases the amount of mixed flow entering the upper side of the printed board 242b in the FRT #1, so that the circuit parts 242a can be efficiently cooled.

The second mixed flow having passed through the FRT #1 is then ejected rearwards from the back side of the FRT #1 (see Arrow F17 in FIG. 18).

(C) Effects:

Since the relay 1 according to an example of the first embodiment has the redundancy achieved by two fan modules 23 installed in each FE 2 as the above, the device can be cooled even when one of the fan modules 23 is stopped or detached for maintenance and the reliability of the entire relay 1 can therefore be improved.

Each fan module 23 has the back face opening 233 and the bottom opening 232, which allow the cooling wind to flow in the two directions towards the back side and the bottom side of the fan module 23. Thereby, both the FRTs 24 arranged in a rear position of the fan modules 23 and the SVC 22 arranged below the fan modules 23 can be efficiently cooled. Namely, this configuration can efficiently cool targets that are to be cooled and that are arranged even in different directions.

The casing of each SVC 22 has an opened top face and an opened back face, so that the board module 221 installed therein is exposed. This configuration allows the cooling wind ejected from the bottom openings 232 of the fan modules 23 to efficiently cool the board module 221.

Furthermore, the first MP opening 2011a and the second MP opening 2011b are formed on the MP 201 arranged in a rear position of the fan modules 23 and the SVC 22. The cooling wind (second diversion FL2) ejected from the back face openings 233 of the fan modules 23 flows through the second MP opening 2011b while the cooling wind (first diversion FL1) having passed through the SVC 22 passes through the first MP opening 2011a.

In the MP 201, the second MP opening 2011b formed in a rear position of the back face openings 233 of the fan modules 23 are larger than the first MP opening 2011a formed in a rear position of the SVC 22. Since a second shielding part 311b of the shielding plate 30 is arranged opposite to the second MP opening 2011b at the downstream position of the second MP opening 2011b, this configuration prevents the entire cooling wind ejected from the second MP opening 2011b from directly flowing into the FRT #1.

Then, in the mixing space 40, the first diversion FL1 flowing through the first MP opening 2011a and the second diversion FL2 flowing through the second MP opening 2011b are mixed, so that roughly the same amount of mixed flow enters both the FRT #1 and the FRT #0 in a rear position of the SVC 22. Thereby, the FRT #0 and the FRT #1 can be similarly cooled.

In addition, since, at the shielding plate 30, the shielding part 311 partially inhibits the cooling wind (mixed flow) from entering the FRTs 24, it is possible to prevent, in the event of hot swapping of an FRT 24, an exceeding amount of cooling wind from entering the space from which the FRT 24 is temporarily removed and each remaining FRT 24 being in the working state can be continuously cooled.

(D) Others:

The above technique are not limited to the foregoing embodiment, and various changes and modifications can be suggested without departing from the spirit of the first embodiment. Each element and each step of the first embodiment may be selected, omitted, and combined according to the requirement.

For example, the arrangement and the number of SVCs 22, fan modules 23, and FRTs 24 included in the relay 1 are not limited to those of the first embodiment, and may be variously modified.

The electronic devices included in the relay 1 are not limited to the SVCs 22 and the FRTs 24, and any device may be included in the relay 1. Those ordinarily skilled in the art can carry out and manufacture the first embodiment by referring to the above disclosure.

According to the first embodiment, an electronic device can be efficiently cooled.

All examples and conditional language recited herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present inventions have been described in detail, it should be understood that the various changes, substitutions, and alterations could be made hereto without departing from the spirit and scope of the invention.

What is claimed is:

1. A container that contains an electronic device, comprising:
    a blower that generates an airflow;
    a first electronic device that is arranged to be adjacent to the blower and is arranged on a first flow path, through which a first diversion divided from the airflow passes;
    a first rectifier comprising a first opening and a second opening, the first diversion being arranged on the first flow path and flowing through the first opening at a downstream portion of the first electronic device, the second opening being arranged on a second flow path, through which a second diversion divided from the airflow passes;
    a mixing room that is arranged at a downstream portion of the first rectifier and that mixes the first diversion having passed through the first opening and the second diversion having passed through the second opening;
    a second rectifier that is arranged at a downstream portion of the mixing room and comprises a third opening and a fourth opening, a mixed airflow of the first diversion and the second diversion passing through the third opening and the fourth opening;
    a second electronic device arranged at a third flow path downstream of the second rectifier, the mixed airflow having passed through the third opening passing through the third flow path; and
    a third electronic device arranged at a fourth flow path downstream of the second rectifier, the mixed airflow having passed through the fourth opening passing through the fourth flow path, the first rectifier is a relay board that is connected to the first electronic device, the second electronic device, and the third electronic device, and relays data communication.

2. The container according to claim 1, wherein the second opening is larger than the first opening.

3. The container according to claim 1, wherein the second rectifier comprises:
    a first shield that inhibits the mixed flow from entering a first region of the second electronic device, the first region being absent from a heat emitting source; and
    a second shield that inhibits the mixed flow from entering a second region of the third electronic device, the second region being absent from a heat emitting source.

4. The container according to claim 3, wherein the second shield is opposite to the second opening in the mixing room.

5. The container according to claim 1, wherein the blower comprises:
    a first blowing outlet that blows the first diversion; and
    a second blowing outlet that blows the second diversion.

6. A relay that relays communication between a plurality of storage controller, the relay comprising:
a blower that generates an airflow;
a controller that is arranged to be adjacent to the blower and is arranged on a first flow path, through which a first diversion divided from the airflow passes;
a first rectifier comprising a first opening and a second opening, the first diversion being arranged on the first flow path and flowing through the first opening at a downstream portion of the controller, the second opening being arranged on a second flow path, through which a second diversion divided from the airflow passes;
a mixing room that is arranged at a downstream portion of the first rectifier and that mixes the first diversion having passed through the first opening and the second diversion having passed through the second opening;
a second rectifier that is arranged at a downstream portion of the mixing room and comprises a third opening and a fourth opening, a mixed airflow of the first diversion and the second diversion passing through the third opening and the fourth opening;
a first connection controller arranged at a third flow path downstream of the second rectifier, the mixed airflow having passed through the third opening passing through the third flow path; and
a second connection controller arranged at a fourth flow path downstream of the second rectifier, the mixed airflow having passed through the fourth opening passing through the fourth flow path.

7. The relay according to claim 6, wherein the second opening is larger than the first opening.

8. The relay according to claim 6, wherein the second rectifier comprises:
a first shield that inhibits the mixed flow from entering a first region of the first connection controller, the first region being absent from a heat emitting source; and
a second shield that inhibits the mixed flow from entering a second region of the second connection controller, the second region being absent from a heat emitting source.

9. The relay according to claim 8, wherein the second shield is opposite to the second opening in the mixing room.

10. The relay according to claim 6 wherein the first rectifier is a relay board that is connected to the controller, the first connection controller, and the second connection controller, and relays data communication.

11. The relay according to claim 6, wherein the blower comprises:
a first blowing outlet that blows the first diversion; and
a second blowing outlet that blows the second diversion.

* * * * *